(12) United States Patent
Yoon (10) Patent No.: US 12,279,376 B2
(45) Date of Patent: Apr. 15, 2025

(54) TRANSFER SYSTEM AND CONTROLLING METHOD THEREOF

(71) Applicant: SEMES CO., LTD., Chungcheongnam-do (KR)

(72) Inventor: Ki Sub Yoon, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 4 days.

(21) Appl. No.: 18/133,435

(22) Filed: Apr. 11, 2023

(65) Prior Publication Data

US 2023/0328946 A1   Oct. 12, 2023

(30) Foreign Application Priority Data

Apr. 11, 2022   (KR) .................. 10-2022-0044495

(51) Int. Cl.
  *B60L 9/00*   (2019.01)
  *B61B 5/00*   (2006.01)
  *H05K 13/08*  (2006.01)

(52) U.S. Cl.
  CPC .............. *H05K 13/086* (2018.08); *B60L 9/00* (2013.01); *B61B 5/00* (2013.01)

(58) Field of Classification Search
  CPC ..... H05K 13/086; B60L 9/00; B60L 2200/26; B60L 53/00; B60L 53/30; B60L 53/32; B60L 53/60; B60L 53/62; B60L 2200/40; B60L 5/00; B60L 50/60; B60L 53/60; B60L 53/122; B60L 58/12; B61B 5/00; Y02T 10/70; H01L 21/67733; H01L 21/67276; H01L 21/67727; H01L 21/67242; H01L 21/67706; H01L 21/6773; H02J 7/00712; H02J 7/00; H02J 7/02; B60M 7/00; B65G 1/00; B65G 1/04
  USPC ....................................................... 307/10.1
  See application file for complete search history.

(56) References Cited

FOREIGN PATENT DOCUMENTS

| JP | 8-324306 | 12/1996 |
|---|---|---|
| JP | H08324306 | * 12/1996 |
| JP | 11-215614 | 8/1999 |
| JP | H11215614 | * 8/1999 |
| JP | 2002351546 | * 12/2002 |
| KR | 10-2020-0039229 | 4/2020 |
| KR | 10-2020-0040512 | 4/2020 |

(Continued)

OTHER PUBLICATIONS

Office Action dated Jan. 23, 2024 for Japanese Patent Application No. 2022-188869 and its English translation from Global Dossier.

(Continued)

*Primary Examiner* — Elim Ortiz
*Assistant Examiner* — Xuan Ly
(74) *Attorney, Agent, or Firm* — WOMBLE BOND DICKINSON (US) LLP (57) ABSTRACT

Provided is a transfer system that efficiently allocates tasks to a plurality of transfer vehicles that operate by the power through a track. The transfer system comprises: a first track installed on a rail; a first power supplier configured to supply power to the first track; a plurality of transfer vehicles configured to move along the rail, have a battery installed inside, and charge the battery by the power from the first track; and a controller configured to allocate tasks of the plurality of transfer vehicles based on a first allowable power in the first track.

19 Claims, 9 Drawing Sheets

(56) References Cited

FOREIGN PATENT DOCUMENTS

| KR | 20200039229 | * | 4/2020 |
|---|---|---|---|
| KR | 10-2172472 | | 10/2020 |
| KR | 10-2021-0107297 | | 9/2021 |
| KR | 20210107297 | * | 9/2021 |
| KR | 10-2022-0005811 | | 1/2022 |

OTHER PUBLICATIONS

Office Action dated Oct. 13, 2023 for Korean Patent Application No. 10-2022-0044495 and its English translation from Global Dossier.
Notice of Allowance dated Sep. 2, 2024 for Korean Patent Application No. 10-2022-0044495 and its English translation from Global Dossier.

* cited by examiner

TRANSFER SYSTEM AND CONTROLLING METHOD THEREOF

CROSS-REFERENCE TO RELATED APPLICATION

This application claims priority from Korean Patent Application No. 10-2022-0044495 filed on Apr. 11, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a transfer system and a controlling method thereof.

2. Description of the Related Art

In the manufacturing process of a semiconductor device, a substrate may be transferred through an unmanned transfer system. Specifically, the unmanned transfer system may include a transport vehicle (e.g., an overhead hoist transport (OHT) and a rail guided vehicle (RGV)) configured to be movable along a rail installed on the ceiling or floor of a clean room. A track to which power is supplied is installed on the rail, and the transfer vehicle operates by the power from the track in a non-contact manner.

SUMMARY

Aspects of the present disclosure provide a transfer system that efficiently allocates tasks to a plurality of transfer vehicles that operate by the power through a track.

Aspects of the present disclosure also provide a controlling method of the transfer system.

The technical aspects of the present disclosure are not restricted to those set forth herein, and other unmentioned technical aspects will be clearly understood by one of ordinary skill in the art to which the present disclosure pertains by referencing the detailed description of the present disclosure given below.

Technical Solution

According to an aspect of the present disclosure, there is provided a transfer system comprising: a first track installed on a rail; a first power supplier configured to supply power to the first track; a plurality of transfer vehicles configured to move along the rail, have a battery installed inside, and charge the battery by the power from the first track; and a controller configured to allocate tasks of the plurality of transfer vehicles based on a first allowable power in the first track.

According to another aspect of the present disclosure, there is provided a transfer system comprising: a track installed on a rail; a power supplier configured to supply power to the track; a plurality of transfer vehicles configured to move along the rail, have a battery installed inside, and charge the battery by the power from the track; and a controller configured to allocate tasks of the plurality of transfer vehicles. When the number of transfer vehicles disposed on the track is the maximum number of charging vehicles, the controller is configured to control a first transfer vehicle among the plurality of transfer vehicles disposed on the track to operate only by the battery, introduce a second transfer vehicle onto the track, move a third transfer vehicle among the plurality of transfer vehicles disposed on the track to another track, and terminate the operation of the first transfer vehicle only by the battery.

According to an aspect of the present disclosure, there is also provided a controlling method of a transfer system comprising: providing the transfer system including a first track installed on a rail, a first power supplier configured to supply power to the first track, and a plurality of transfer vehicles configured to move along the rail and have a battery installed inside; when a first allowable power in the first track exceeds a first reference power, introducing a transfer vehicle with a charge amount below a second reference charge amount onto the first track; and when the first allowable power in the first track is below a second reference power, moving a transfer vehicle disposed on the first track and having a charge amount below the second reference charge amount to another track.

Specific details of other embodiments are included in the detailed description and the drawings.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, embodiments of the present disclosure will be described with reference to the attached drawings. The merits and characteristics of the present disclosure and a method for achieving the merits and characteristics will become more apparent from the embodiments described in detail in conjunction with the accompanying drawings. However, the present disclosure is not limited to the disclosed embodiments, but may be implemented in various different ways. The embodiments are provided to only complete the disclosure of the present disclosure and to allow those skilled in the art to understand the category of the present disclosure. The present disclosure is defined by the category of the claims. Like numbers refer to like elements throughout the description of the figures.

The spatially relative terms "below", "beneath", "lower", "above", and "upper" may be used to easily describe the correlation of a device or components with other devices or components. Spatially relative terms are to be understood as including terms in different directions of the device in use or operation in addition to the directions shown in the figures. For example, when flipping a device shown in the figure, a device described as "below" or "beneath" of another device may be placed "above" of another device. Thus, the exemplary term "below" can encompass both an orientation of above and below. The device can also be oriented in other directions, so that spatially relative terms can be interpreted according to orientation.

Although the first, second, etc. are used to describe various elements, components and/or sections, these elements, components and/or sections are of course not limited by these terms. These terms are only used to distinguish one element, component or section from another element, component or section. Therefore, the first device, the first component, or the first section mentioned below may be a second device, a second component, or a second section within the technical spirit of the present disclosure.

Hereinafter, preferred embodiments according to the present disclosure are described in detail with reference to the accompanying drawings. The same or similar elements are assigned the same reference numerals irrespective of their reference numerals, and a redundant description thereof is omitted.

Figure 1:
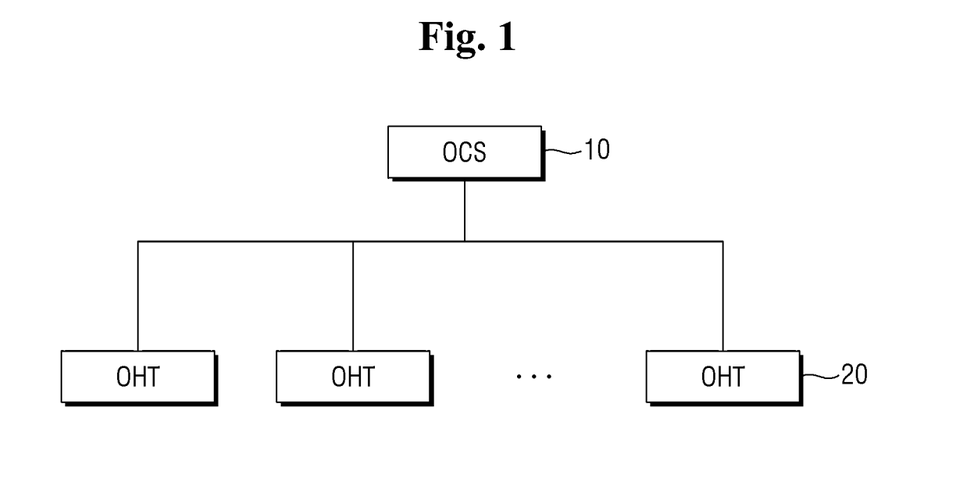
FIG. 1 is a block diagram explaining a transfer system according to some embodiments of the present disclosure.
Figure 2:
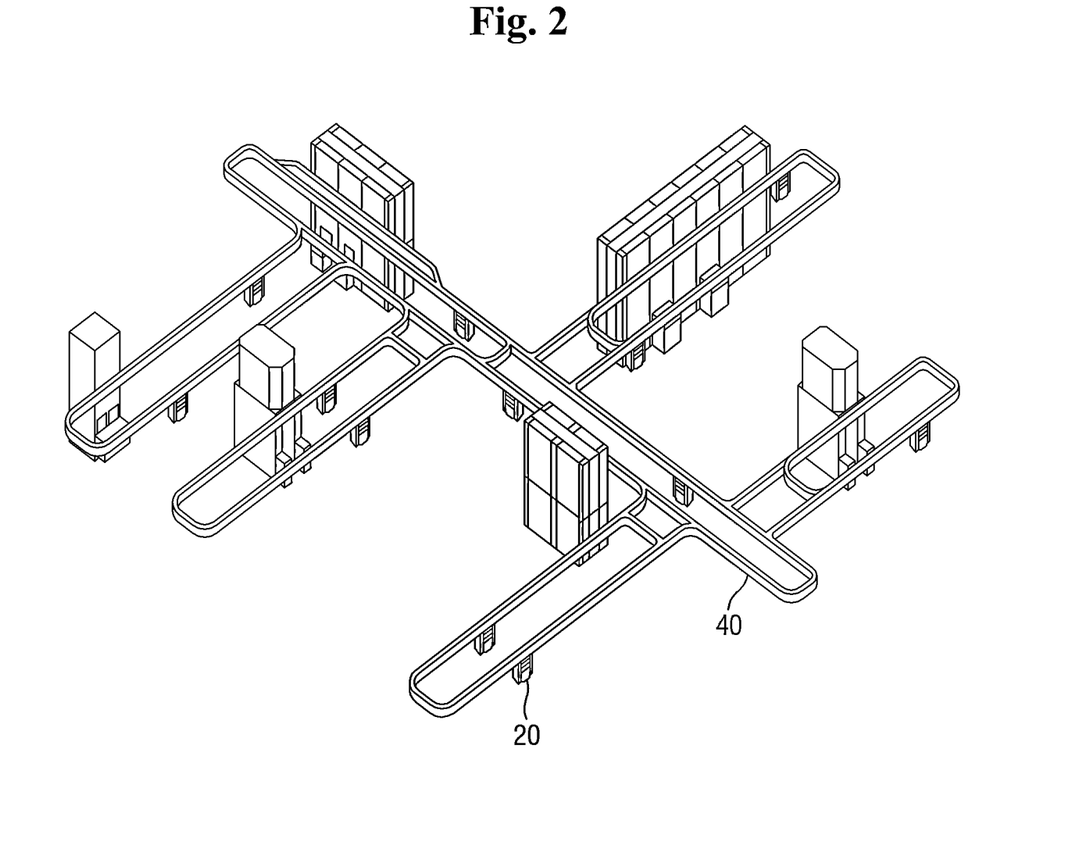
FIG. 2 is a structural view schematically illustrating the transfer system of FIG. 1.
Figure 3:
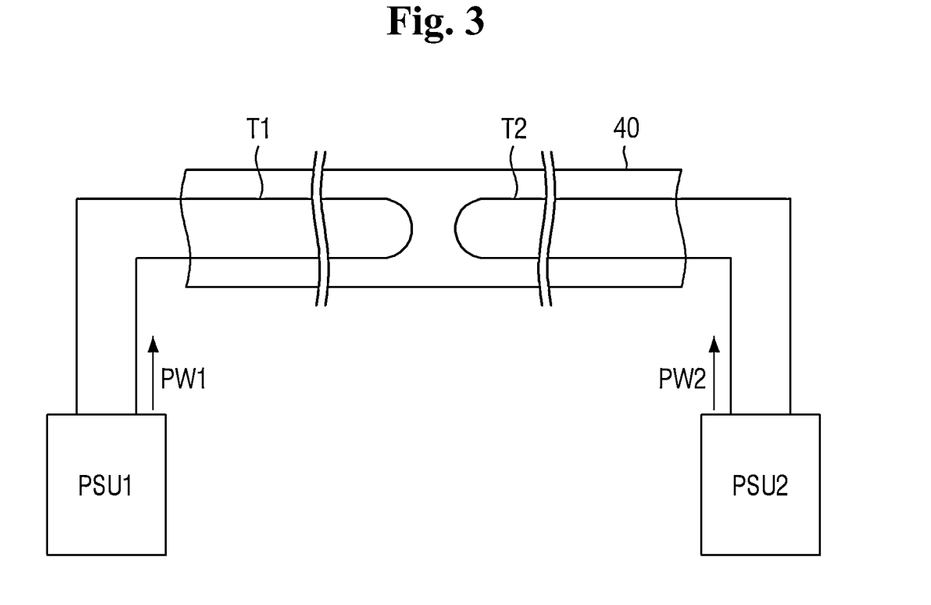
FIG. 3 is a conceptual diagram explaining a track installed on a rail.
Figure 4:
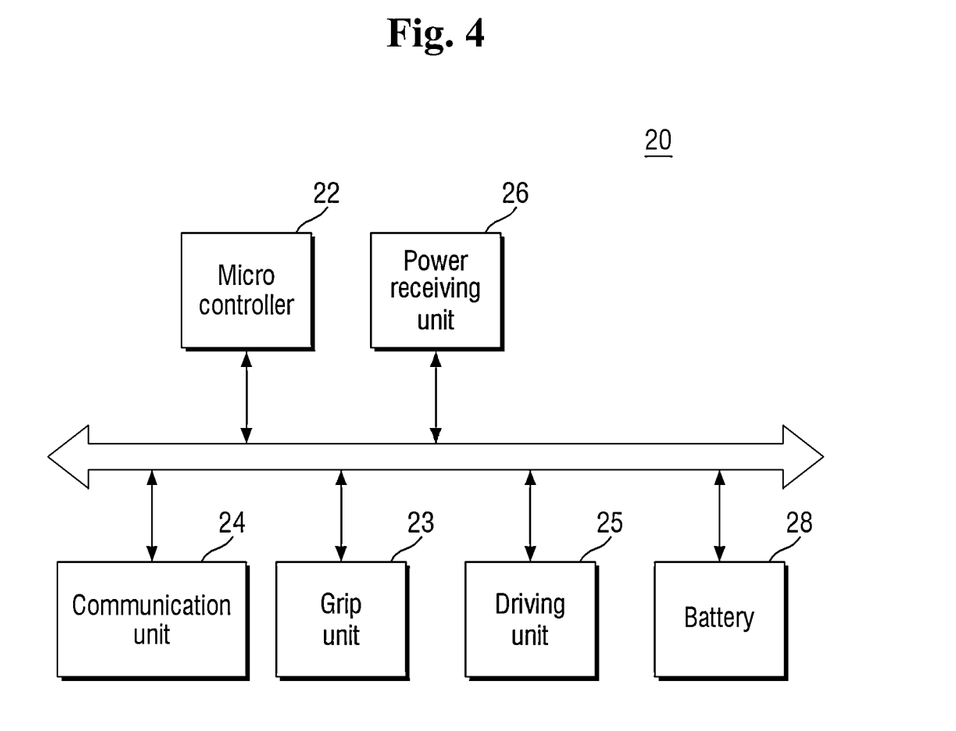
FIG. 4 is a block diagram explaining the structure of the transfer vehicle illustrated in FIG. 1.

FIG. 1 is a block diagram explaining a transfer system according to some embodiments of the present disclosure. FIG. 2 is a structural view schematically illustrating the transfer system of FIG. 1. FIG. 3 is a conceptual diagram explaining a track installed on a rail. FIG. 4 is a block diagram explaining the structure of the transfer vehicle illustrated in FIG. 1.

First, referring to FIGS. 1 and 2, the transfer system according to some embodiments of the present disclosure includes a controller 10 (or an OHT control system (OCS)), a plurality of transfer vehicle 20, and a rail 40.

The rail 40 may be installed in a semiconductor manufacturing line. The rail 40 may be installed on the ceiling of the semiconductor manufacturing line, but the present disclosure is not limited thereto.

The transfer vehicle 20 moves along the rail 40 and transfers a container where the substrate is accommodated. The transfer vehicle 20 may be, for example, an overhead hoist transport (OHT), but the present disclosure is not limited thereto. The container to be transferred may be, for example, a front opening unified pod (FOUP), but the present disclosure is not limited thereto.

The transfer vehicle 20 and the controller 10 may interface with each other in a wireless communication way. The controller 10 provides an instruction according to a task process to the transfer vehicle 20. Specifically, the controller 10 searches for the shortest route from an origin to a specific destination so that a transferring operation can be efficiently completed, selects the transfer vehicle 20 at an optimal position to perform the transferring operation, and provides a transfer instruction.

Herein, referring to FIG. 3, a plurality of tracks T1 and T2 are installed on the rail 40.

The plurality of tracks T1 and T2 include a first track T1 and a second track T2. The first track T1 and the second track T2 may be physically separated from each other. A first power supplier PSU1 is connected to the first track T1 and supplies a power PW1 to the first track T1.

A second power supplier PSU2 is connected to the second track T2 and supplies a power PW2 to the second track T2.

The transfer vehicle 20 receives the power PW1 and PW2 from the first track T1 and/or the second track T2 in a non-contact manner. The transfer vehicle 20 may perform an (un)loading operation, a driving operation, an acceleration operation and a waiting operation, and charge an internal battery by using the supplied power PW1 and PW2.

Although FIG. 3 illustrates that the two tracks T1 and T2 are installed, the present disclosure is not limited thereto.

A unit length of the track T1 may be determined in consideration of the capacity of the power supplier PSU1 configured to supply power to the track (e.g., T1), the number of transfer vehicles 20 capable of simultaneously receiving power from the track T1, and the arrangement and structure of the rail 40. With an increase of the total length of the rail 40, the number of installed tracks also increases. For instance, it is assumed the unit length of the track is 50 m. When the rail 40 is 100 m, two tracks can be installed, when the rail 40 is 150 m, three tracks can be installed, and when the rail 40 is 200 m, four tracks can be installed.

Referring to FIG. 4, the transfer vehicle 20 includes a microcontroller 22, a grip unit 23, a communication unit 24, a driving unit 25, a power receiving unit 26, and a battery 28.

The grip unit 23 is meant to grip a container, and the driving unit 25 is meant for the transfer vehicle 20 to move along the rail 40. The communication unit 24 is meant to communicate with the controller 10 (see FIG. 1), and the power receiving unit 26 is meant to receive the power PW1 and PW2 from the tracks T1 and T2. The battery 28 is meant to charge the power PW1 and PW2 received from the tracks T1 and T2. The microcontroller 22 controls the grip unit 23, the communication unit 24, the driving unit 25, the power receiving unit 26, and the battery 28.

The transfer vehicle 20 receives instructions from the controller 10 through the communication unit 24. The indications may include, for example, a movement instruction, a transferring instruction, a power mode instruction, a charging manner indication. The movement instruction is an instruction to move to a position designated by the controller 10, and the transferring instruction is an instruction to pick up the container from the origin and move the same to the destination. The power mode instruction may be an instruction to operate by the power PW1 and PW2 from the tracks T1 and T2, to operate only by the power charged in the battery 28 without receiving the power from the tracks T1 and T2, or to use both the power PW1 and PW2 received from the tracks T1 and T2 and the power charged in the battery 28. Furthermore, the charging manner instruction relates to a charging speed of the battery 28 and may indicate charging the battery 28 at a reference charging speed, charging the battery 28 at a charging speed slower than the reference charging speed, or charging the battery 28 at a charging speed that exceeds the reference charging speed. The microcontroller 22 interprets the instructions of the controller 10 and controls the other units 23, 24, 25, 26 and 28 according to the instructions.

In addition, the microcontroller 22 may provide the current state of the transfer vehicle to the controller 10 through the communication unit 24. The current state of the transfer vehicle 20 may include, for example, at least one of an (un)loading state, a driving state, an acceleration state, and a waiting state. Alternatively, the current state of the transfer vehicle 20 may further include at least one of the charge amount, the charging speed, and the discharge amount (i.e., the amount of use) of the battery 28.

Referring back to FIGS. 1 to 4, a plurality of transfer vehicles 20 move along the rail 40. Furthermore, some of the plurality of transfer vehicles 20 may be disposed on the first track T1, and other transfer vehicles 20 may be disposed on the second track T2.

The controller 10 may allocate tasks of the plurality of transfer vehicles 20 based on at least one of a first allowable power in the first track T1 and a second allowable power in the second track T2. The first allowable power refers to a magnitude of a more available power in the first track T1, while the second allowable power refers to a magnitude of a more available power in the second track T2. For instance, based on at least one of the first and second allowable power, the controller 10 may move the transfer vehicle 20 disposed on the first track T1 and satisfying a predetermined condition to the second track T2, control the charging speed of the transfer vehicle 20 disposed on the first track T1, or selectively introduce the transfer vehicle 20 satisfying the predetermined condition onto the first track T1.

Hereinafter, a method for assigning the tasks of the plurality of transfer vehicles 20 will be described with reference to FIGS. 5 to 18.

Figure 5:
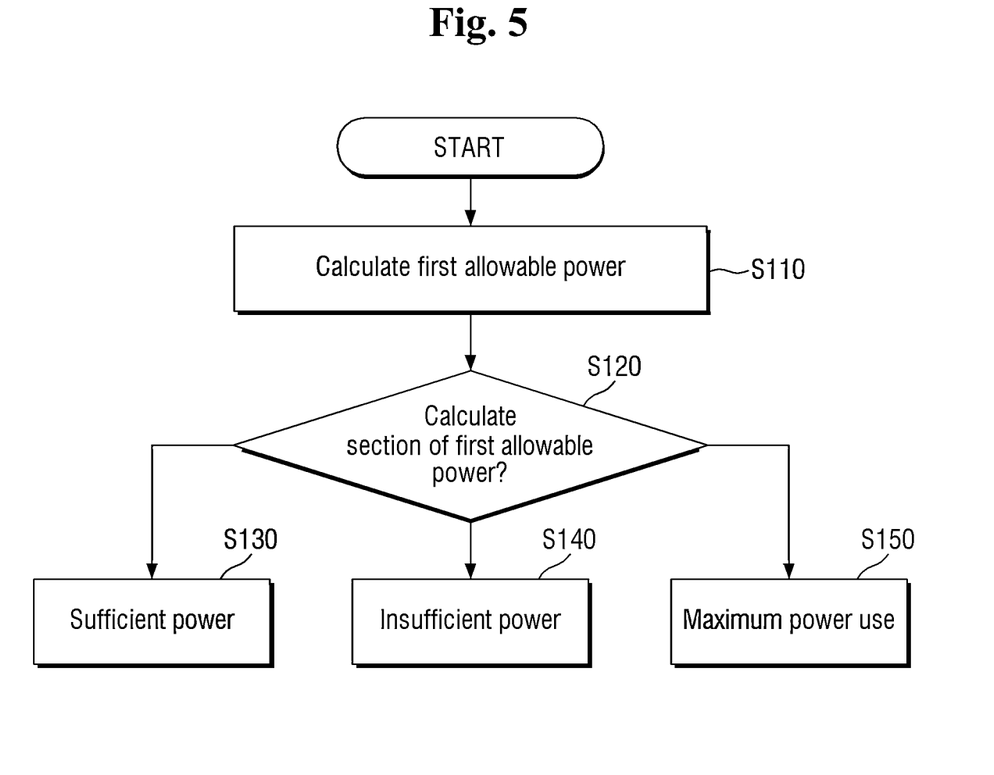
FIG. 5 is a flowchart explaining a controlling method of the transfer system according to one embodiment of the present disclosure.
Figure 6:
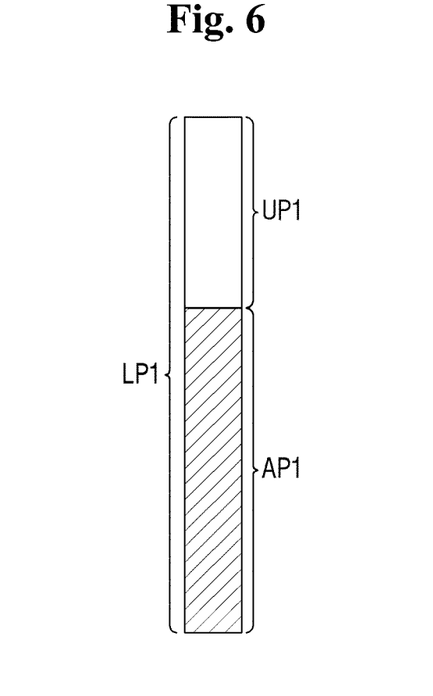
FIG. 6 is a view explaining a method of calculating a first allowable power.
Figure 7:
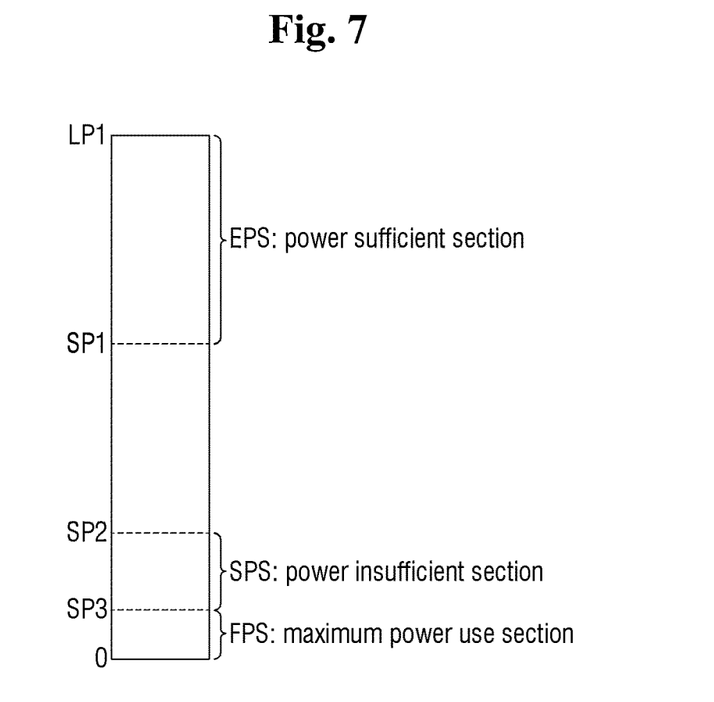
FIG. 7 is a view explaining a section to which the first allowable power belongs.
Figure 8:
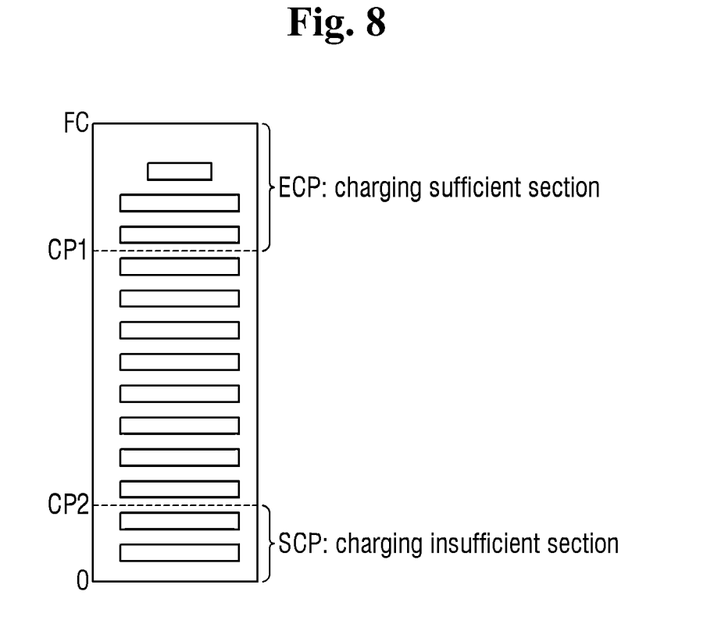
FIG. 8 is a view explaining a section to which a charge amount of the transfer vehicle belongs.
Figure 9:
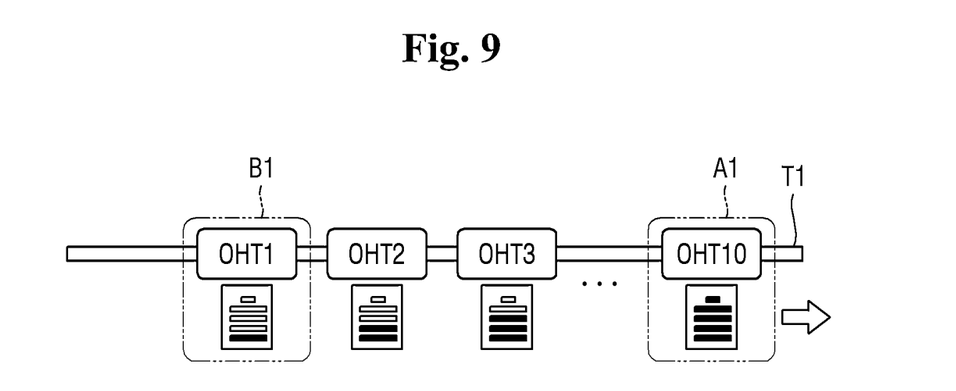
FIGS. 9 and 10 are views explaining a task allocation method when the first allowable power belongs to a power sufficient section EPS.
Figure 10:
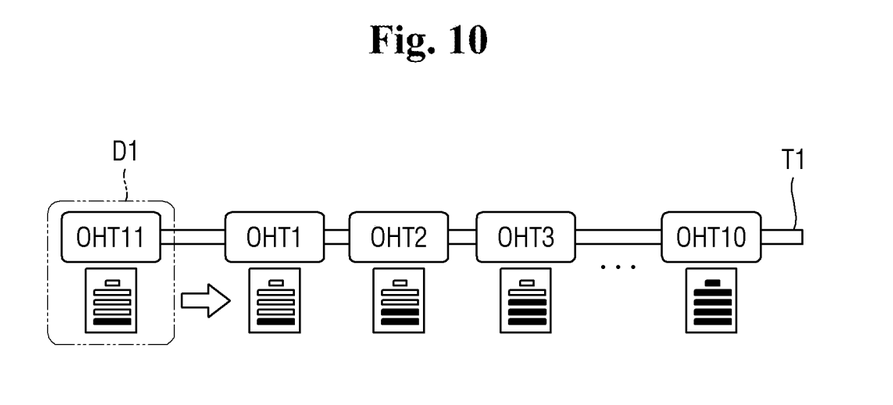
Figure 11:
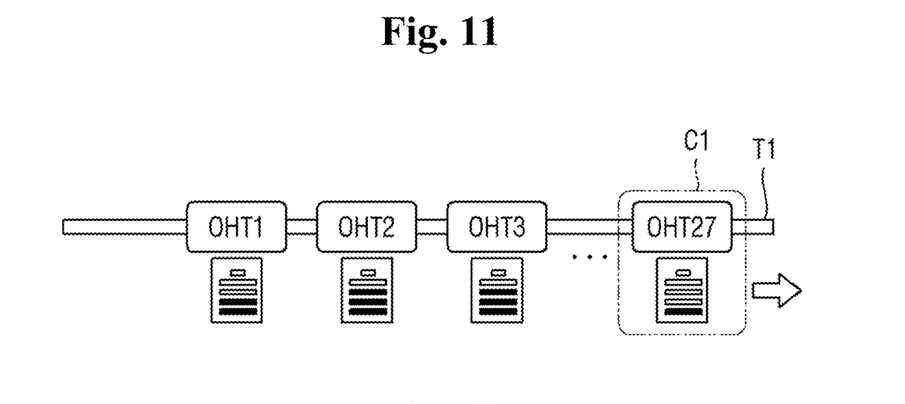
FIGS. 11 to 13 are views explaining a task allocation method when the first allowable power belongs to a power insufficient section SPS.
Figure 12:
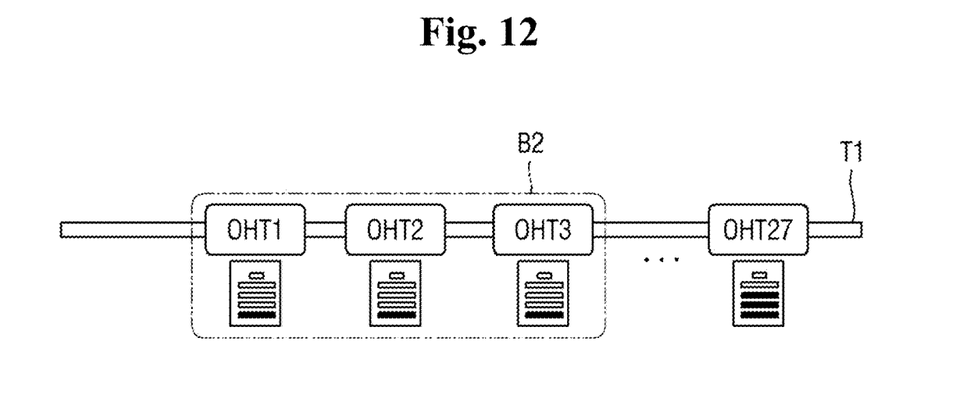
Figure 13:
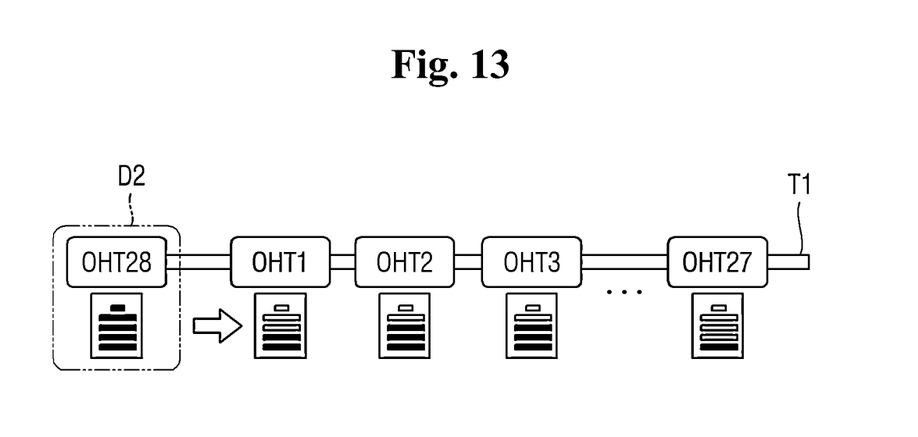
Figure 14:
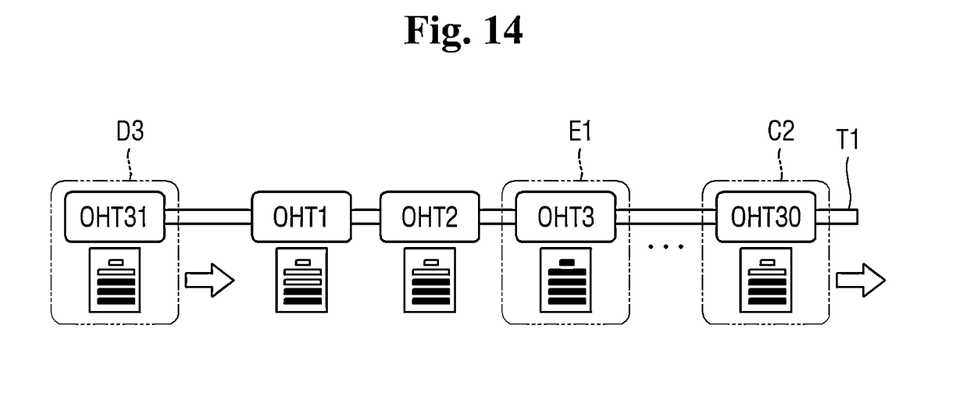
FIG. 14 is a view explaining a task allocation method when the first allowable power belongs to a maximum power use section FPS.

FIG. 5 is a flowchart explaining a controlling method of the transfer system according to one embodiment of the present disclosure. FIG. 6 is a view explaining a method of calculating a first allowable power. FIG. 7 is a view explaining a section to which the first allowable power belongs. FIG. 8 is a view explaining a section to which a charge amount of the transfer vehicle belongs. FIGS. 9 and 10 are views explaining a task allocation method when the first allowable power belongs to a power sufficient section EPS. FIGS. 11 to 13 are views explaining a task allocation method when the first allowable power belongs to a power insufficient section SPS. FIG. 14 is a view explaining a task allocation method when the first allowable power belongs to a maximum power use section FPS.

First, referring to FIG. 5, the first allowable power AP1 in the first track T1 is calculated (S110 of FIG. 5).

Specifically, as illustrated in FIG. 6, the first allowable power AP1 refers to the magnitude of a more available power in the first track T1. The first allowable power AP1 may be a value obtained by subtracting a first used power UP1 in the first track T1 from a first limit power LP1 in the first track T1. The first limit power LP1 refers to the power supplied to the first track T1 by the first power supplier PSU1. The first used power UP1 refers to the power used by the plurality of transfer vehicles 20 disposed on the first track T1. In other words, the first allowable power AP1 corresponds to the remainder obtained by subtracting a previously used power from the power supplied to the first track T1.

For instance, the first power supplier PSU1 supplies 30 kW to the first track T1, and the power used by the plurality of transfer vehicles 20 disposed on the first track T1 is 8 kW.

In that case, since the first limit power LP1 is 30 kW and the first used power UP1 is 8 kW, the first allowable power AP1 may be 22 kW.

The first used power UP1 (i.e., the power used by the plurality of transfer vehicles 20) may be obtained by adding an actual used power in each of the plurality of transfer vehicles 20. For instance, each of the plurality of transfer vehicles 20 transmits the actual used power to the controller 10, and the controller 10 can obtain the first used power UP1 by adding all the transmitted actual used power.

Alternatively, the first used power UP1 may be calculated based on the number of transfer vehicles 20 disposed on the first track T1. For instance, it is assumed that the first power supplier PSU1 supplies 30 kW to the first track T1, and the maximum power that can be used by one transfer vehicle 20 is 1 kW. The first used power UP1 can be obtained by considering only the number of transfer vehicles 20 disposed on the first track T1 without considering the amount of power used by each of the plurality of transfer vehicles 20. When the number of transfer vehicles 20 disposed on the first track T1 is eight, the first used power UP1 may be determined to be 8 kW.

In addition, in the aforementioned embodiment, the maximum number of transfer vehicles 20 that can be disposed on the first track T1 (i.e., the maximum number of transfer vehicles 20 that can be charged on the first track T1) becomes 30 (∵30=30 kW/1 kW). The controller 10 can recognize that when the first allowable power AP1 is 22 kW (∵22 kW=30 kW−8 kW), 22 additional transfer vehicles 20 may be charged on the first track T1.

In consideration of the aforementioned descriptions, all of the first used power UP1, the first allowable power AP1, and the first limit power LP1 may be expressed as the number of transfer vehicles 20. In the aforementioned embodiment, the first limit power LP1 is 30 transfer vehicles and the first used power UP1 is eight transfer vehicles; therefore, the first allowable power AP1 may be expressed as 22 transfer vehicles (∵22=30-8).

When this manner is used, state data transmitted from the transfer vehicle 20 to the controller 10 is reduced. In other words, the transfer vehicle 20 does not transmit the actual used power to the controller 10, instead, it transmits in which track the transfer vehicle 20 is present (i.e., position information of the transfer vehicle 20). This results in a low risk of a transmission error of the transfer vehicle 20 and an arithmetic operation error of the controller 10.

Alternatively, when a sensor for power sensing is installed in the first power supplier PSU1, the sensor may measure the power used in the first track (i.e., the first used power UP1). The first power supplier PSU1 transmits the first used power UP1 measured by the sensor to the controller 10) and accordingly, the controller 10 can recognize the first used power UP1 without any additional arithmetic operation. As a result, the controller 10 may quickly calculate the first allowable power AP1 in the first track T1.

Then, the section to which the calculated first allowable power AP1 belongs is checked (S120 of FIG. 5).

Specifically, as illustrated in FIG. 7, the section in which the first allowable power AP1 is below a third reference power SP3 is the maximum power use section FPS. In the aforementioned embodiment, since 30 transfer vehicles 20 are disposed on the first track T1, the number of transfer vehicles 20 that can be additionally charged on the first track T1 may be zero. Depending on the design, even when there is one transfer vehicle 20 that can be additionally charged on the first track T1 because 29 transfer vehicles 20 are disposed on the first track T1, this may be included in the maximum power use section FPS. Said differently, the maximum power use section FPS corresponds to a section where the first allowable power AP1 is considerably small.

A section in which the first allowable power AP1 is more than the third reference power SP3 and less than a second reference power SP2 is a power insufficient section SPS. In the aforementioned embodiment, since 27 or 28 transfer vehicles 20 are disposed on the first track T1, there may be two or three transfer vehicles 20 that can be additionally charged on the first track T1. Depending on the design, when there is one transfer vehicle 20 additionally chargeable to the first track T1, this may be included in the power insufficient section SPS.

A section in which the first allowable power AP1 is more than a first reference power SP1 is the power sufficient section EPS. In the aforementioned embodiment, there may be 15 or more transfer vehicles 20 that can be additionally charged on the first track T1. The magnitude of the first reference power SP1 may be adjusted differently depending on the design, and for instance, the first reference power SP1 the second reference power SP2 may be equal to each other.

Meanwhile, as a result of checking the section to which the first allowable power AP1 belongs, when the first allowable power AP1 is in the power sufficient section EPS, the tasks of the transfer vehicle 20 are allocated as follows (S130 in FIG. 5).

Specifically, referring to FIG. 9, a plurality of transfer vehicles OHT1 to OHT10 are disposed on the first track T1. For instance, the first power supplier PSU1 supplies 30 kW of power, and 10 transfer vehicles OHT1 to OHT10 are disposed on the first track T1. Since the first allowable power AP1 of the first track T1 exceeds the first reference power SP1, the first allowable power AP1 corresponds to the power sufficient section EPS.

In that case, the controller 10 moves and introduces the transfer vehicle OHT10 with a sufficient charge amount onto another track (e.g., the second track T2) (see reference numeral A1).

In addition, among the plurality of transfer vehicles OHT1 to OHT10 disposed on the first track T1, the transfer vehicle OHT1 with an insufficient charge amount is preferentially charged (see reference numeral B1).

Herein, the transfer vehicle (e.g., OHT10) with the sufficient charge amount means that the charge amount of the battery 28 (see FIG. 4) installed in the transfer vehicle OHT10 is sufficient. The transfer vehicle (e.g., OHT1) with the insufficient charge amount means that the charge amount of the battery 28 installed in the transfer vehicle OHT1 is insufficient. Furthermore, a "sufficient" or "insufficient" charge amount of the battery 28 can be defined as follows. As illustrated in FIG. 8, when the charge amount of the battery 28 is below a second reference charge amount CP2, it may be determined that the battery 28 belongs to a charging insufficient section SCP, i.e., the charge amount of the battery 28 is insufficient. Likewise, when the charge amount of the battery 28 exceeds a first reference charge amount CP1, it may be determined that the battery 28 belongs to a charging sufficient section ECP, i.e., the charge amount of the battery 28 is sufficient.

Referring to FIG. 10, the plurality of transfer vehicles OHT1 to OHT10 are disposed on the first track T1. The first allowable power AP1 corresponds to the power sufficient section EPS.

In order to enter the first track T1, several transfer vehicles may be waiting. In that case, the charge amount of waiting transfer vehicles is checked, and the transfer vehicle (e.g., OHT11) with the insufficient charge amount is first introduced onto the first track T1 (see reference numeral D1). For instance, when a transfer vehicle with 10% charge, a transfer vehicle with 60% charge, and a transfer vehicle with 80% charge are waiting, the transfer vehicle with the lowest charge amount (i.e., the transfer vehicle with 10% charge) is first introduced onto the first track T1. This makes it possible to preferentially charge the transfer vehicle OHT11 with the insufficient charge amount.

Meanwhile, as a result of checking the section to which the first allowable power AP1 belongs, when the first allowable power AP1 is in the power insufficient section SPS, the tasks of the transfer vehicle 20 are allocated as follows (S140 of FIG. 5).

Specifically, referring to FIGS. 11 and 12, a plurality of transfer vehicles OHT1 to OHT27 are disposed on the first track T1. For instance, the first power supplier PSU1 supplies 30 kW of power, and 27 transfer vehicles OHT1 to OHT27 are disposed on the first track T1. Since the first allowable power AP1 of the first track T1 is more than the third reference power SP3 and less than the second reference power SP2, the first allowable power AP1 corresponds to the power insufficient section SPS.

In that case, the controller 10 moves and introduces the transfer vehicle OHT27 with the insufficient charge amount to another track (i.e., a track with sufficient allowable power) (see reference numeral C1).

Alternatively, the controller 10 charges the transfer vehicles OHT1 to OHT3 with the insufficient charge amount at a charging speed slower than the reference charging speed (see reference numeral B2 in FIG. 12).

In other words, the transfer vehicle OHT27 disposed adjacent to another track is not charged on the first track T1, but moves to another track to get charged on that track. On the other hand, the transfer vehicles OHT1 to OHT3 have to be on the first track T1 until the other transfer vehicles OHT4 to OHT27 disposed in front move to another track. Accordingly, while the transfer vehicles OHT1 to OHT3 are charged, their charging speed is lower than the reference charging speed.

Referring to FIG. 13, the plurality of transfer vehicles OHT1 to OHT27 are disposed on the first track T1. The first allowable power AP1 corresponds to the power insufficient section SPS.

In order to enter the first track T1, several transfer vehicles may be waiting. In that case, the charge amount of the transfer vehicles is checked, and the transfer vehicle (e.g., OHT28) with the sufficient charge amount is first introduced onto the first track T1 (see reference numeral D2). For instance, when the transfer vehicle with 10% charge, the transfer vehicle with 60% charge, and the transfer vehicle with 80% charge are waiting, the transfer vehicle with the highest charge (i.e., the transfer vehicle with 80% charge) is first introduced onto the first track T1. This makes it impossible to increase a load of power usage in the first track T1.

Meanwhile, as a result of checking the section to which the first allowable power AP1 belongs, when the first allowable power AP1 is in the maximum power use section FPS, the tasks of the transfer vehicle 20 are allocated as follows (S150 of FIG. 5).

Specifically, referring to FIG. 14, a plurality of transfer vehicles OHT1 to OHT30 are disposed on the first track T1. For instance, the first power supplier PSU1 supplies 30 kW of power, and 30 transfer vehicles OHT1 to OHT30 are disposed on the first track T1. Since the first allowable power AP1 of the first track T1 is below the third reference power SP3, the first allowable power AP1 corresponds to the maximum power use section FPS.

30 transfer vehicles OHT1 to OHT30 are disposed on the first track T1, and the 30 vehicles may be the maximum number of transfer vehicles 20 capable of receiving power from the first track T1.

However, in order to enter the first track T1, a transfer vehicle OHT31 may be waiting.

To introduce the transfer vehicle OHT31, at least one transfer vehicle (e.g., OHT3) among the transfer vehicles OHT1 to OHT30 is first controlled to operate only with the battery (see reference numeral E1). This is meant to prevent overloading of the first track T1.

Then, the waiting transfer vehicle OHT31 is introduced onto the first track T1 (see reference numeral D3). Herein, 31 transfer vehicles OHT1 to OHT31 are disposed on the first track T1. Accordingly, the number (i.e., 31 vehicles) of the transfer vehicles OHT1 to OHT31 disposed on the first track T1 exceeds the maximum number (i.e., 30 vehicles) of the first track T1.

In addition, alternatively, when the charge amount of some of the transfer vehicles (e.g., OHT1) is insufficient among the plurality of transfer vehicles OHT1 to OHT31, the transfer vehicle OHT1 can be charged at the charging speed slower than the reference charging speed.

Then, at least one (e.g., OHT30) of the transfer vehicles OHT1 to OHT30 is moved to another track (see reference numeral C2).

Then, the operation of the transfer vehicle OHT3 only with the battery is terminated. Since the transfer vehicle OHT30 moves outside the first track T1, the number of the transfer vehicles OHT1 to OHT29 and OHT31 on the first track T1 becomes 30. In other words, the number (i.e., 30 vehicles) of the transfer vehicles OHT1 to OHT29 and OHT31 disposed on the first track T1 is equal to the maximum number (i.e., 30 vehicles) of the first track T1. Therefore, it is not necessary for the transfer vehicle OHT3 to operate only with the battery.

Figure 15:
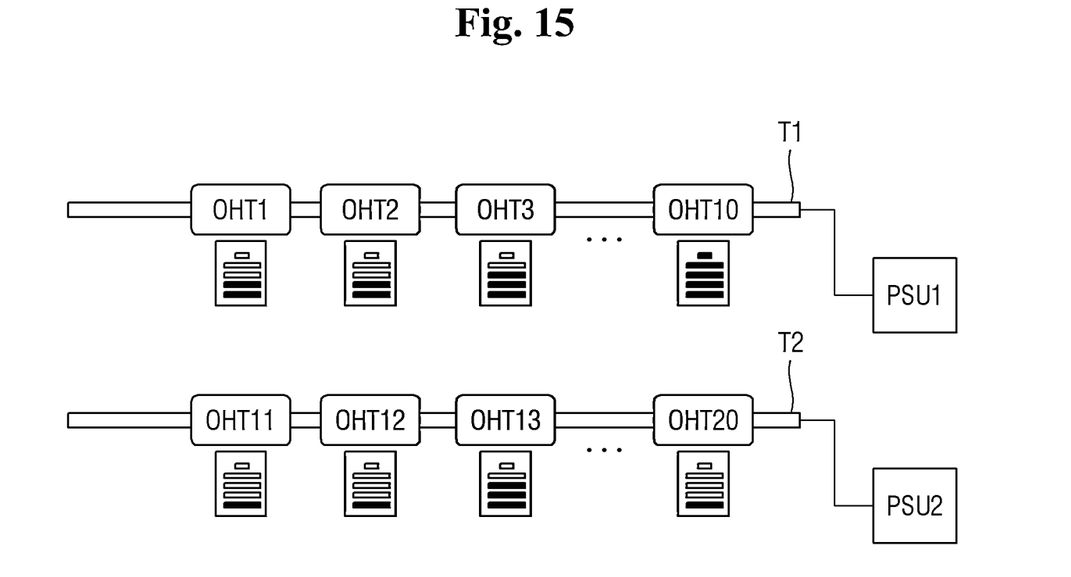
FIGS. 15 and 16 are views explaining the controlling method of the transfer system according to another embodiment of the present disclosure.
Figure 16:
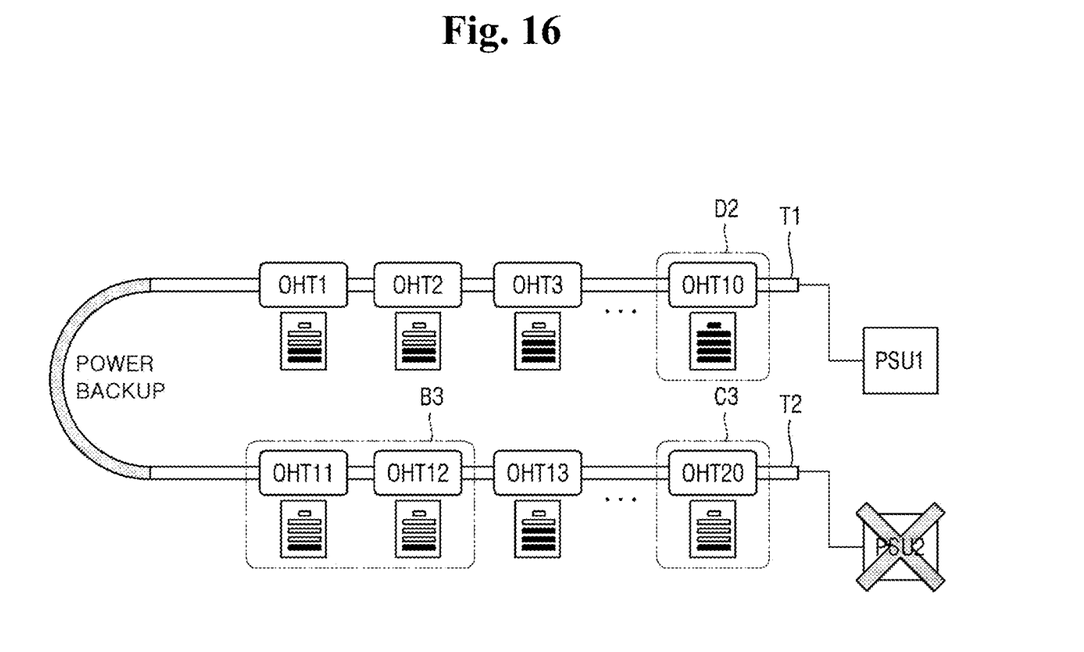

FIGS. 15 and 16 are views explaining the controlling method of the transfer system according to another embodiment of the present disclosure.

First, referring to FIG. 15, the first power supplier PSU1 supplies power to the first track T1, and a plurality of transfer vehicles OHT1 to OHT10 are disposed on the first track T1. The plurality of transfer vehicles OHT1 to OHT10 are charged by the power supplied by the first track T1.

The second power supplier PSU2 supplies power to the second track T2, and a plurality of transfer vehicles OHT11 to OHT20 are disposed on the second track T2. The plurality of transfer vehicles OHT11 to OHT20 are charged by the power supplied by the second track T2.

Then, referring to FIG. 16, the second power supplier PSU2 suddenly stops operating. In that case, power backup is performed. The first track T1 and the second track T2 may be connected via a connection track. In that case, the first power supplier PSU1 may supply power not only to the first track T1 but also to the second track T2 via the connection track. The first power supplier PSU1 supplies power to the transfer vehicles OHT11 to OHT20 on the second track T2 so that they can operate. Accordingly, the number of the transfer vehicles that receive power from the first power supplier PSU1 suddenly increases from 10 vehicles (i.e., OHT1 to OHT10) to 20 vehicles (i.e., OHT1 to OHT20). Herein, in order to prevent a sudden increase in load, the following task allocation is performed.

First, at least one (e.g., OHT10) of the plurality of transfer vehicles OHT1 to OHT20 disposed on the first track T1 and the second track T2 is operated only with the battery (see reference numeral D2). The charge amount of the selected transfer vehicle OHT10 may belong to the charging sufficient section ECP.

In addition, at least one (e.g., OHT20) of the plurality of transfer vehicles OHT1 to OHT20 is moved to another track with sufficient allowable power (see reference numeral C3).

In addition, the plurality of transfer vehicles OHT1 to OHT20 may be controlled to be charged at the charging speed slower than the reference charging speed. Specifically, some (e.g., OHT11 and OHT12) of the transfer vehicles OHT1 to OHT20 are controlled to be charged at the charging speed slower than the reference charging speed (see reference numeral B3).

Figure 17:
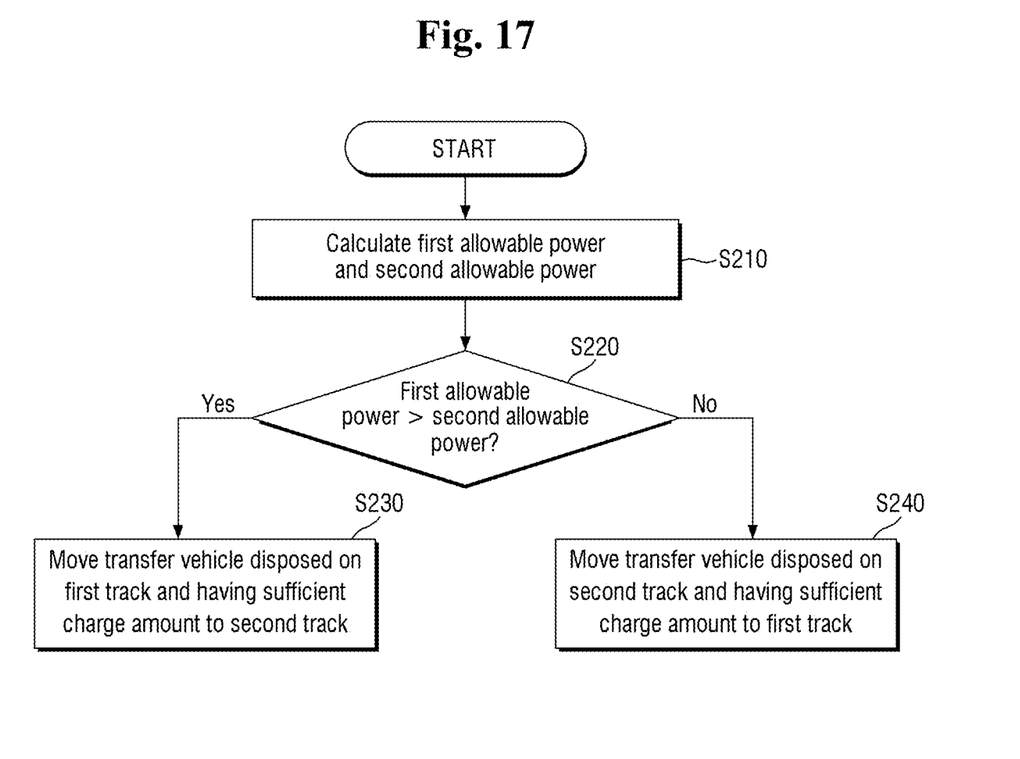
FIG. 17 is a flowchart explaining the controlling method of the transfer system according to another embodiment of the present disclosure.

FIG. 17 is a flowchart explaining the controlling method of the transfer system according to another embodiment of the present disclosure. For convenience of description, the differences from the content described using FIGS. 5 to 16 will be mainly described.

Referring to FIG. 17, the first allowable power AP1 in the first track and the second allowable power AP2 in the second track are calculated (S210).

As described with reference to FIG. 6, the first allowable power AP1 in the first track may be a value obtained by subtracting the first used power UP1 in the first track from the first limit power LP1 in the first track. Herein, the first used power UP1 may be calculated as the sum of the actual used power of the plurality of transfer vehicles disposed on the first track. Alternatively, the first used power UP1 may be calculated based on the number of transfer vehicles disposed on the first track. Alternatively, the first used power UP1 may be calculated as a value measured by a sensor for power sensing installed in the first power supplier.

The second allowable power AP2 in the second track may also be calculated in the same manner as described above. In other words, the second allowable power AP2 may be a value obtained by subtracting a second used power UP2 in the second track from a second limit power LP2 in the second track. Herein, the second used power UP2 may be calculated as the sum of the actual used power of the plurality of transfer vehicles disposed on the second track. Alternatively, the second used power UP2 may be calculated based on the number of transfer vehicles disposed on the second track. Alternatively, the second used power UP2 may be calculated as a value measured by a sensor for power sensing installed in the second power supplier.

Then, the first allowable power AP1 and the second allowable power AP2 are compared (S220).

The first allowable power AP1 exceeds the second allowable power (yes in S220), and the transfer vehicle with the sufficient charge amount among the plurality of transfer vehicles disposed on the first track may be moved to the second track (S230). In other words, in the state where the second allowable power AP2 of the second track is insufficient, the transfer vehicle in advance entering the second track may have a sufficient charge amount.

In addition, the transfer vehicle with the insufficient charge amount among the plurality of transfer vehicles disposed on the second track may be moved to the first track. The transfer vehicle with the insufficient charge amount is charged on the first track. In other words, in the state where the first allowable power AP1 of the first track is sufficient, the transfer vehicle in advance entering the first track may have an insufficient charge amount.

The second allowable power AP2 exceeds the first allowable power (no in S220), and the transfer vehicle with the sufficient charge amount among the plurality of transfer vehicles disposed on the second track may be moved to the first track (S240). In other words, in the state where the first allowable power AP1 of the first track is insufficient, the transfer vehicle in advance entering the first track may have a sufficient charge amount.

In addition, the transfer vehicle with the insufficient charge amount among the plurality of transfer vehicles disposed on the first track may be moved to the second track. The transfer vehicle with the insufficient charge amount is charged on the second track. In other words, in the state where the second allowable power AP2 of the second track is sufficient, the transfer vehicle in advance entering the second track first may have an insufficient charge amount.

Figure 18:
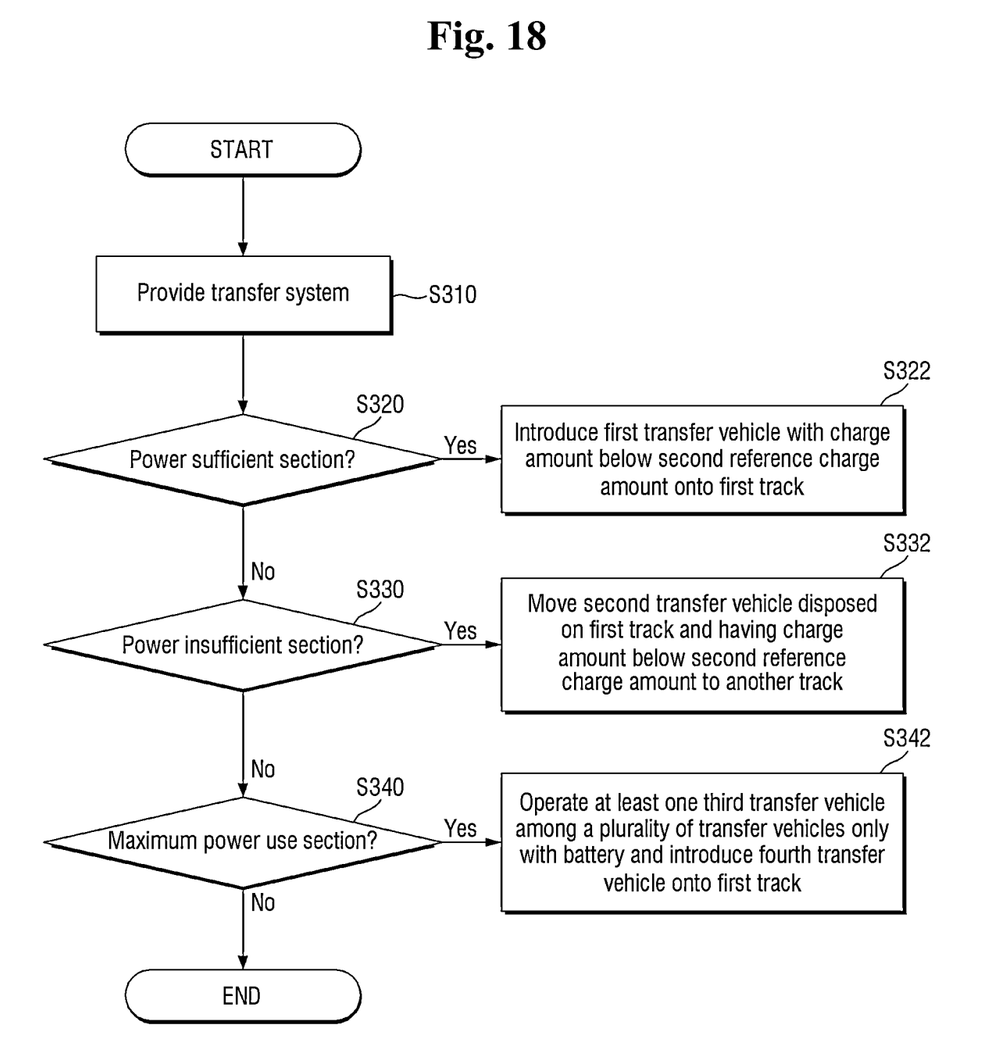
FIG. 18 is a flowchart explaining the controlling method of the transfer system according to another embodiment of the present disclosure.

FIG. 18 is a flowchart explaining the controlling method of the transfer system according to another embodiment of the present disclosure. For convenience of description, the differences from the content described using FIGS. 5 to 16 will be mainly described.

Referring to FIG. 18, the transfer system is provided (S310). For instance, the transfer system includes the first track installed on a rail, the first power supplier configured to supply power to the first track, and the plurality of transfer vehicles configured to move along the rail and having a battery installed inside.

Then, it is checked whether the first allowable power AP1 in the first track belongs to the power sufficient section EPS (S320).

When the first allowable power AP1 belongs to the power sufficient section EPS (yes in S320), a first transfer vehicle with a charge amount below the second reference charge amount CP2 enters the first track (S322). Alternatively, the transfer vehicle disposed on the first track may be charged at a charging speed that exceeds the reference charging speed.

Then, it is checked whether the first allowable power AP1 in the first track belongs to the power insufficient section SPS (S330).

When the first allowable power AP1 belongs to the power insufficient section SPS (yes in S330), a second transfer vehicle disposed on the first track and having a charge amount below the second reference charge CP2 is moved to another rack (i.e., a track with sufficient allowable power) (S322). In addition, the transfer vehicle with a charge amount that exceeds the first reference charge amount CP1 is preferentially introduced onto the first track. The transfer vehicles disposed on the first track and lacking battery remains are charged at a lower charging speed (i.e., slower than the reference charging speed).

Then, it is checked whether the first allowable power AP1 in the first track belongs to the maximum power use section FPS (S340).

When the first allowable power AP1 belongs to the maximum power use section FPS (yes in S340), at least one third transfer vehicle among the plurality of transfer vehicles operates only with the battery, and a fourth transfer vehicle enters the first track (S342). In this way, the number of transfer vehicles disposed on the first track may exceed the maximum number of charging vehicles on the first track. In addition, a fifth transfer vehicle among the plurality of transfer vehicles on the first track is moved to another track, and the operation of the third transfer vehicle only with the battery is terminated.

Although the embodiments of the present disclosure have been described above with reference to the accompanying drawings, the present disclosure is not limited to the disclosed embodiments, but may be implemented in various different ways, and the present disclosure may be embodied in many different forms without changing technical subject matters and essential features as will be understood by those skilled in the art. Therefore, embodiments set forth herein are exemplary only and not to be construed as a limitation.

What is claimed is:

1. A transfer system, comprising:
a first track installed on a rail;
a first power supplier configured to supply power to the first track;
a plurality of transfer vehicles configured to move along the rail, have a battery installed inside, and charge the battery by the power from the first track; and
a controller configured to allocate tasks of the plurality of transfer vehicles based on a first allowable power in the first track, the first allowable power including a value calculated by subtracting a first used power in the first track from a first limit power in the first track,
wherein each of the plurality of transfer vehicles is configured to transmit information on an actual used power to the controller, and the controller is configured to calculate the first used power by summing the actual used power of the plurality of transfer vehicles transmitted from the plurality of transfer vehicles.

2. The transfer system of claim 1, wherein the first used power is calculated based on the number of transfer vehicles disposed on the first track.

3. The transfer system of claim 1, wherein the first power supplier includes a sensor for sensing the power used in the first track, and the first used power is a value measured by the sensor.

4. The transfer system of claim 1, wherein the first allowable power exceeds a first reference power, and the controller moves a transfer vehicle disposed on the first track and having a charge amount that exceeds a first reference charge amount to another track with an allowable power below the first allowable power.

5. The transfer system of claim 4, wherein the controller first charges a transfer vehicle with a charge amount below a second reference charge amount among the plurality of transfer vehicle disposed on the first track, wherein the second reference charge amount is below the first reference charge amount.

6. The transfer system of claim 1, wherein the first allowable power is below the second reference power, and the controller moves a transfer vehicle disposed on the first track and having a charge amount below a second reference charge amount to another track with an allowable power that exceeds the first allowable power.

7. The transfer system of claim 1, wherein the first allowable power is below the second reference power, and the controller charges the plurality of transfer vehicles disposed on the first track at a charging speed slower than a reference charging speed.

8. The transfer system of claim 7, wherein the first allowable power is below a third reference power, the third reference power is below the second reference power, and the controller controls at least one of the plurality of transfer vehicles disposed on the first track to operate only with the battery and then moves a transfer vehicle disposed on another track to the first track.

9. The transfer system of claim 8, wherein a first maximum number of charging vehicles on the first track means the maximum number of transfer vehicles capable of receiving power from the first track, and after moving the transfer vehicle on another track to the first track, the number of transfer vehicles disposed on the first track exceeds the first maximum number of charging vehicles.

10. The transfer system of claim 1, further comprising:
a second track installed on the rail; and
a second power supplier configured to supply power to the second track,
wherein, when the second power supplier suddenly stops operating, the controller controls the first power supplier to supply power to the first track and the second track.

11. The transfer system of claim 10, wherein the controller controls at least one of the plurality of transfer vehicles disposed on the first and second tracks to operate only with the battery and charges the transfer vehicles disposed on the first and second tracks at a charging speed slower than a reference charging speed.

12. A transfer system, comprising:
a track installed on a rail;
a power supplier configured to supply power to the track;
a plurality of transfer vehicles configured to move along the rail, have a battery installed inside, and charge the battery by the power from the track; and
a controller configured to allocate tasks of the plurality of transfer vehicles,
wherein
the controller is configured to, when the number of transfer vehicles disposed on the track is a maximum number of charging vehicles,
control a first transfer vehicle among the plurality of transfer vehicles disposed on the track to operate only by the battery,
introduce a second transfer vehicle onto the track,
move a third transfer vehicle among the plurality of transfer vehicles disposed on the track to another track, and
terminate the operation of the first transfer vehicle only by the battery.

13. The transfer system of claim 12, comprising: after the second transfer vehicle enters the track, charging a transfer vehicle disposed on the track and having a charge amount below a reference charge amount at a charging speed slower than a reference charging speed before the third transfer vehicle moves to another track.

14. A controlling method of a transfer system, the method comprising:
providing the transfer system including a first track installed on a rail, a first power supplier configured to supply power to the first track, and a plurality of transfer vehicles configured to move along the rail and have a battery installed inside;
when a first allowable power in the first track exceeds a first reference power, introducing a transfer vehicle with a charge amount below a second reference charge amount onto the first track; and
when the first allowable power in the first track is below a second reference power, moving a transfer vehicle disposed on the first track and having a charge amount below the second reference charge amount to another track.

15. The controlling method of a transfer system of claim 14, further comprising: when the first allowable power in the first track exceeds the first reference power, charging the transfer vehicle disposed on the first track at a charging speed that exceeds a reference charging speed.

16. The controlling method of a transfer system of claim 14, further comprising: when the first allowable power in the first track is below the second reference power, charging the transfer vehicle disposed on the first track at a charging speed slower than the reference charging speed.

17. The controlling method of a transfer system of claim 14, wherein the transfer system further comprises:
a second track installed on the rail; and
a second power supplier configured to supply power to the second track,
wherein, when the second power supplier suddenly stops operating, the first power supplier is further configured to supply power to the first and second tracks.

18. The controlling method of a transfer system of claim 17, further comprising: controlling at least one of the plurality of transfer vehicles disposed on the first and second tracks to operate with only the battery.

19. The transfer system of claim 1, wherein the controller is configured to, when the first allowable power is below a third reference power, control at least one of the plurality of transfer vehicles disposed on the first track to be operated with the battery only and move a transfer vehicle disposed on another track to the first track such that after the transfer vehicle disposed on the another track is moved to the first track a number of the plurality of transfer vehicles disposed on the first track exceeds a maximum number of transfer vehicles to which the first track is capable of supplying the power.

* * * * *